(12) United States Patent
Sasaki

(10) Patent No.: US 8,233,140 B2
(45) Date of Patent: Jul. 31, 2012

(54) MEASURING APPARATUS, EXPOSURE APPARATUS, AND DEVICE FABRICATION METHOD

(75) Inventor: Ryo Sasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 943 days.

(21) Appl. No.: 12/239,936

(22) Filed: Sep. 29, 2008

(65) Prior Publication Data

US 2009/0091723 A1 Apr. 9, 2009

(30) Foreign Application Priority Data

Oct. 3, 2007 (JP) ................................. 2007-260358

(51) Int. Cl.
*G03B 27/52* (2006.01)
*G03B 27/68* (2006.01)
*G01B 11/02* (2006.01)
(52) U.S. Cl. ............................ 355/55; 355/52; 356/511
(58) Field of Classification Search .................... 355/53, 355/55, 77, 52; 356/511
See application file for complete search history.

(56) References Cited

U.S. PATENT DOCUMENTS

| | | | |
|---|---|---|---|
| 2,684,015 A * | 7/1954 | Grey | 359/351 |
| 3,856,409 A * | 12/1974 | Cindrich et al. | 356/138 |
| 5,398,113 A | 3/1995 | de Groot | |
| 5,693,439 A | 12/1997 | Tanaka et al. | |
| 6,249,351 B1 | 6/2001 | de Groot | |
| 2004/0189964 A1 * | 9/2004 | Nijmeijer et al. | 355/55 |
| 2007/0086013 A1 | 4/2007 | De Lega et al. | |

FOREIGN PATENT DOCUMENTS

| | | |
|---|---|---|
| JP | 06-260391 A | 9/1994 |
| JP | 2000-097622 A | 4/2000 |
| JP | 2000-105101 A | 4/2000 |

* cited by examiner

*Primary Examiner* — Toan Ton
*Assistant Examiner* — Deoram Persaud
(74) *Attorney, Agent, or Firm* — Canon USA Inc. IP Division

(57) ABSTRACT

The present invention provides a measuring apparatus which measures a shape of a surface of a measurement target object, comprising a light projecting optical system configured to split light from a light source into measurement light and reference light so that the measurement light enters the surface of the measurement target object and the reference light enters a reference mirror, a light receiving optical system configured to guide the measurement light reflected by the surface of the measurement target object and the reference light reflected by the reference mirror to a photoelectric conversion device, and a processing unit configured to calculate the shape of the surface of the measurement target object based on an interference pattern which is detected by the photoelectric conversion device and formed by the measurement light and the reference light.

9 Claims, 15 Drawing Sheets

Prior Art

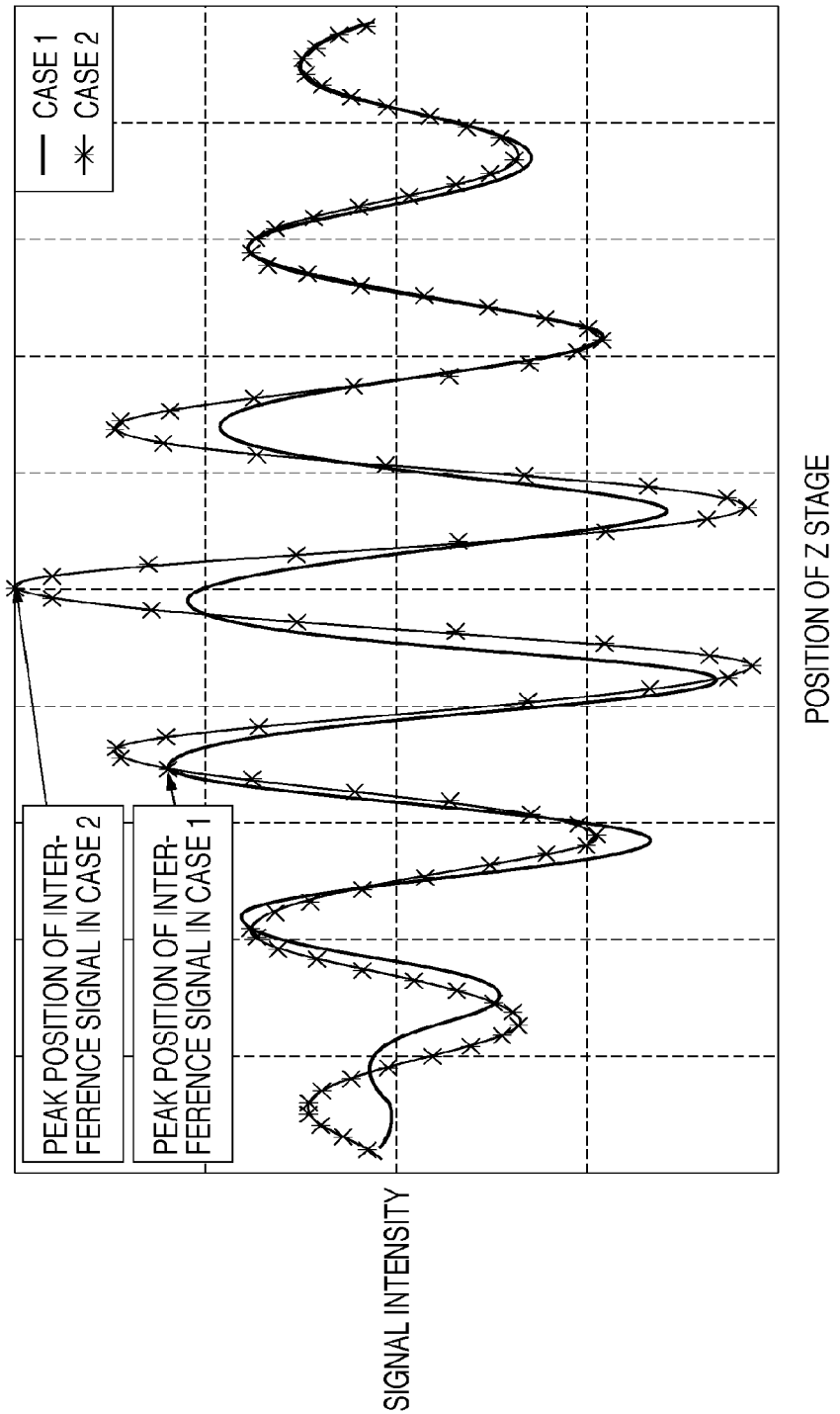

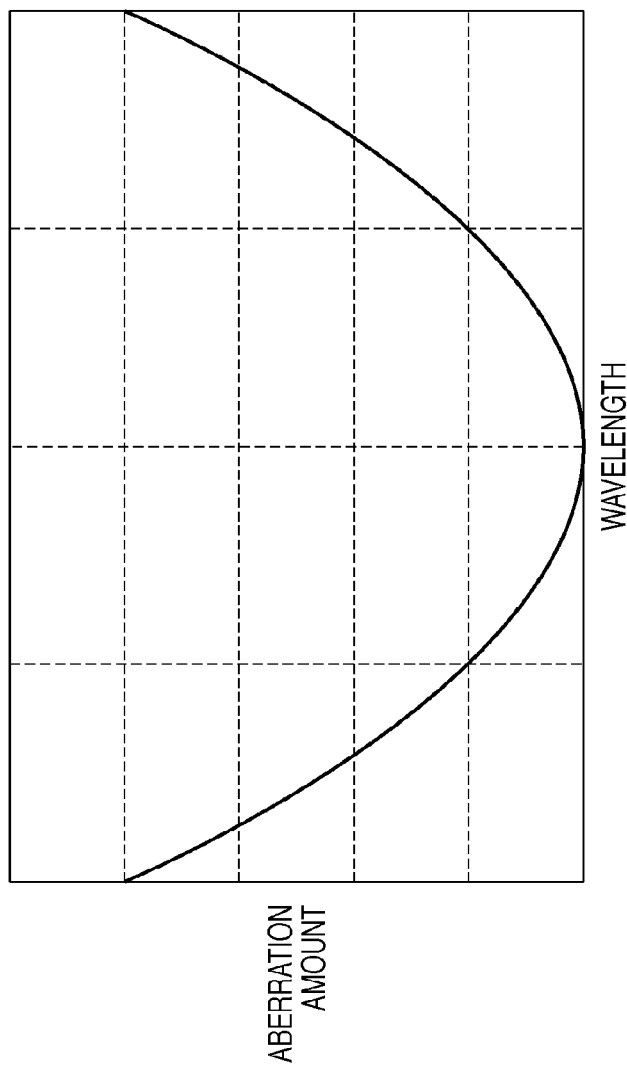

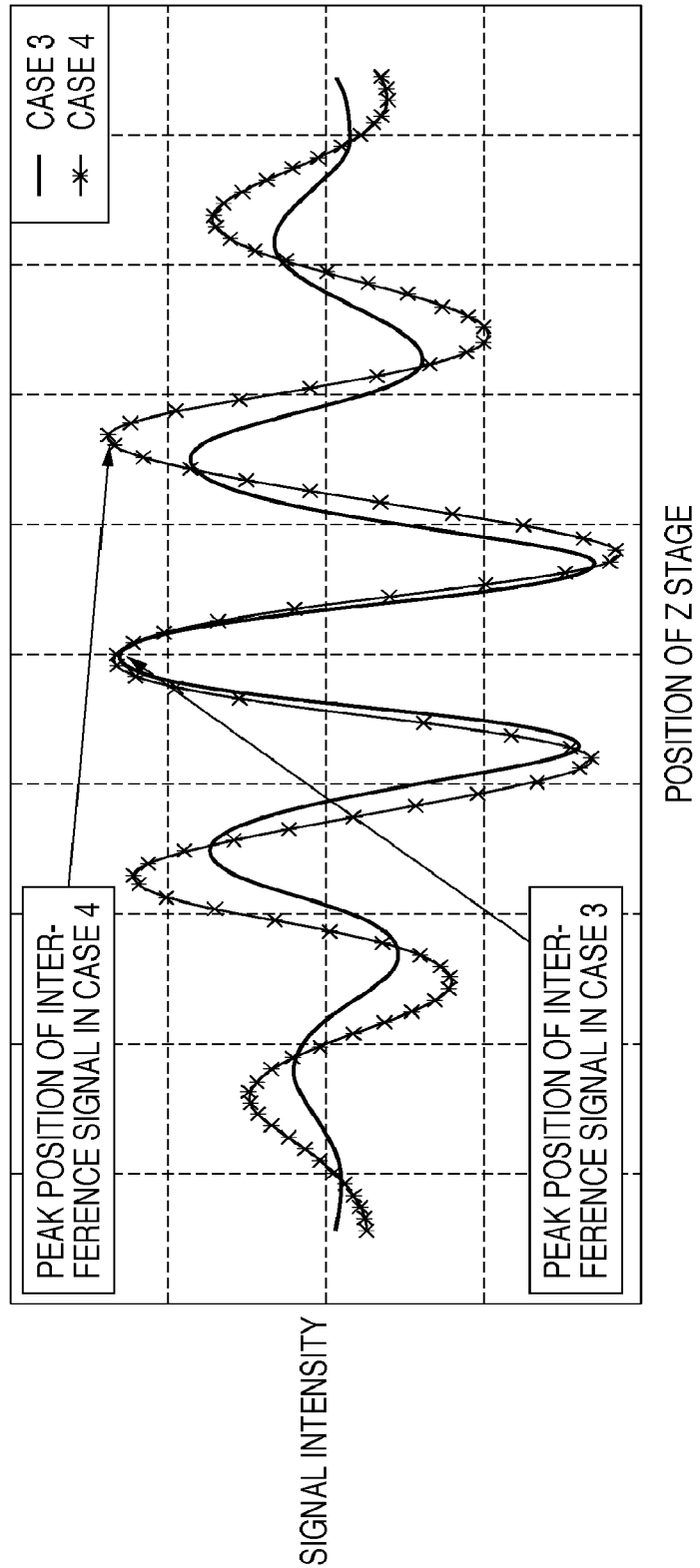

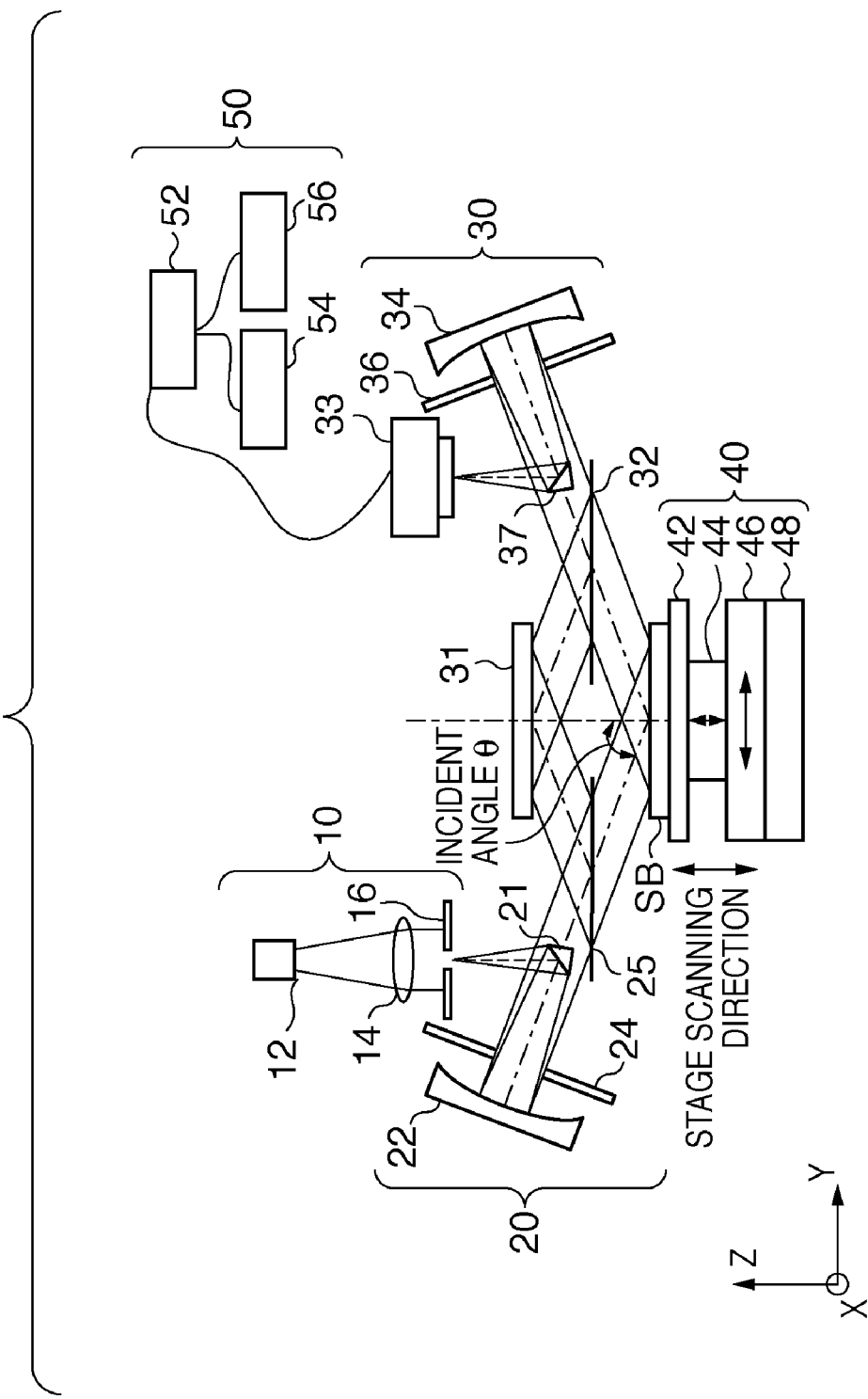

MEASURING APPARATUS, EXPOSURE APPARATUS, AND DEVICE FABRICATION METHOD

BACKGROUND OF THE INVENTION

1. Field of the Invention

The present invention relates to a measuring apparatus, an exposure apparatus, and a device fabrication method.

2. Description of the Related Art

A projection exposure apparatus has conventionally been employed to fabricate a micropatterned semiconductor device such as a semiconductor memory or logic circuit or a liquid crystal device by using photolithography. The projection exposure apparatus projects and transfers a pattern formed on a reticle (mask) onto a substrate such as a wafer by a projection optical system.

Along with advance in micropatterning and an increase in packing density of semiconductor devices, the projection optical system is required to project and transfer the pattern of a reticle onto a substrate by exposure with a higher resolution. A minimum line width (resolution) that the projection exposure apparatus can transfer is proportional to the wavelength of light for use in exposure (exposure light), and is inversely proportional to the numerical aperture (NA) of the projection optical system. According to this principle, the shorter the wavelength of the exposure light, and the higher the NA of the projection optical system, the better the resolution. In view of this, in recent years, a KrF excimer laser (wavelength: about 248 nm) or an ArF excimer laser (wavelength: about 193 nm) is used as the exposure light source. The practical application of immersion exposure which increases the NA of the projection optical system by filling the space between the projection optical system and the substrate with a liquid is also in progress. Furthermore, the projection exposure apparatus is required to expose a wider exposure region.

To meet these demands, an exposure apparatus of the step & scan scheme (scanner) is becoming the mainstream in place of an exposure apparatus of the step & repeat scheme (stepper). The stepper herein means an exposure apparatus which reduces an almost square exposure region and performs full-plate projection exposure of the exposure region on a substrate. The scanner herein means an exposure apparatus which uses an exposure region having a rectangular slit shape (exposure slit), and relatively scans the reticle and the substrate at high speed, thereby exposing a large area with high accuracy.

Before a predetermined position on the substrate reaches the exposure slit, the scanner measures the surface position of the substrate at the predetermined position by a surface position detection unit of the oblique incidence system, and performs correction to match the substrate surface with an optimal imaging position in exposing the predetermined position. To measure not only the height (focus) of the substrate surface position but also the tilt of the surface, a plurality of measurement points are set at the preceding stage and succeeding stage of the exposure slit along the longitudinal direction of the exposure slit (i.e., a direction perpendicular to the scanning direction). Details of the focus and tilt measurement techniques are proposed in Japanese Patent Laid-Open No. 6-260391 and U.S. Pat. No. 6,249,351. For example, Japanese Patent Laid-Open No. 6-260391 discloses a technique which uses an optical sensor. U.S. Pat. No. 6,249,351 discloses a technique which uses a capacitance sensor.

However, in recent years, along with the shortening of the exposure light and an increase in the NA of the projection optical system, the depth of focus is becoming very small and therefore the accuracy of matching the surface of a substrate to be exposed with an optimal imaging position, that is, the so-called focus accuracy is increasingly becoming stricter. More specifically, measurement errors attributed to the performance of an optical system which forms the surface position detection unit are becoming non-negligible in the surface position detection unit.

U.S. Pat. No. 6,249,351 discloses a technique of measuring the shape of a substrate based on an interference signal obtained by obliquely irradiating the substrate with light, as shown in FIG. 11. However, the technique disclosed in U.S. Pat. No. 6,249,351 measures the shape of a measurement target object corresponding to a wafer with an error due to the influence of the optical imaging performance of an optical system formed from lenses which are inserted between the measurement target object and an image sensing device, and adjust the measurement target object and the image sensing device to have an imaging relationship. Note that FIG. 11 is a schematic view showing the arrangement of a conventional measuring apparatus which measures the shape of a measurement target object.

FIG. 12 shows interference signals (the so-called white light interference signals) obtained by scanning the measurement target object in a direction perpendicular to its surface via an actuator in the conventional measuring apparatus shown in FIG. 11. The interference signal in case 1 shown in FIG. 12 is the one obtained under a relatively small influence of the aberration of the optical system (lens). On the other hand, because the optical system (lens) generally has wavelength-dependent aberration amounts (the so-called chromatic aberration) as shown in FIG. 13, an interference signal as in case 2 shown in FIG. 12 is obtained in the conventional measuring apparatus. The interference signal in case 2 is distorted due to the influence of the aberration of the optical system (lens), as compared with that in case 1. Such distortion of the interference signal generates an error in the measurement value of the substrate shape profile. It is possible to decrease the aberration of the optical system by increasing the number of lenses of the optical system or using an expensive glass material for the optical system. However, a broadband light source is desirably used to obtain a white light interference signal, so it is very difficult to decrease the aberration of the optical system. Even when an optical system having a small aberration can be attained by increasing the number of lenses of the optical system or using an expensive glass material for the optical system, this entails a significantly high cost.

As a commonly-used technique of improving the contrast of the white light interference signal, it is known to widen the wavelength range of light which irradiates the substrate. When the substrate surface is coated with a thin film such as a resist, it is thought to be effective to widen the wavelength range on the short-wavelength side. In this case, the transmittance on the short-wavelength side is often relatively low depending on the glass material used, which may exert an adverse influence on the interference signal.

FIG. 14 is a graph showing interference signals (white light interference signals) obtained by widening the wavelength range of light which irradiates the measurement target object and scanning the measurement target object in a direction perpendicular to its surface in the conventional measuring apparatus shown in FIG. 11. The interference signal in case 3 shown in FIG. 14 is the one obtained when the absorbance of the glass material on the short-wavelength side is low (i.e., the transmittance is high). The interference signal in case 4 shown in FIG. 14 is the one obtained when the absorbance of the glass material on the short-wavelength side is high (i.e., the transmittance is low). Referring to the interference signal in case 4, light components in the short-wavelength range are absorbed so that a desired low coherency may not be obtained, resulting in the generation of an error in the measurement value of the substrate shape profile.

In a phenomenon called solarization, a glass material absorbs light components having short wavelengths, it suffers an internal defect and therefore its transmittance on the short-wavelength side decreases. When this occurs, depending on the time taken to irradiate the measurement target object with light, the spectroscopic characteristics of a light component reflected by a reference surface and those of a light component reflected by the substrate surface change, resulting in the generation of an error in the measurement value of the substrate shape profile.

SUMMARY OF THE INVENTION

The present invention provides a measuring apparatus which can measure the shape of a measurement target object with high accuracy by reducing the influence of the aberration of an optical system and that of a change in spectroscopic characteristics attributed to the transmittance of a glass material.

According to the first aspect of the present invention, there is provided a measuring apparatus which measures a shape of a surface of a measurement target object, comprising a light projecting optical system configured to split light from a light source into measurement light and reference light so that the measurement light enters the surface of the measurement target object and the reference light enters a reference mirror, a light receiving optical system configured to guide the measurement light reflected by the surface of the measurement target object and the reference light reflected by the reference mirror to a photoelectric conversion device, and a processing unit configured to calculate the shape of the surface of the measurement target object based on an interference pattern which is detected by the photoelectric conversion device and formed by the measurement light and the reference light, wherein at least one of the light projecting optical system and the light receiving optical system includes an imaging optical system including a plurality of mirrors, and a magnification of the imaging optical system is determined by the plurality of mirrors.

According to the second aspect of the present invention, there is provided a measuring apparatus which measures a shape of a surface of a measurement target object, comprising a light projecting optical system configured to split light from a light source into measurement light and reference light so that the measurement light enters the surface of the measurement target object and the reference light enters a reference mirror, a light receiving optical system configured to guide the measurement light reflected by the surface of the measurement target object and the reference light reflected by the reference mirror to a photoelectric conversion device, and a processing unit configured to calculate the shape of the surface of the measurement target object based on an interference pattern which is detected by the photoelectric conversion device and formed by the measurement light and the reference light, wherein at least one of the light projecting optical system and the light receiving optical system includes a mirror having optical power.

According to the third aspect of the present invention, there is provided an exposure apparatus comprising an illumination optical system configured to illuminate a reticle, a projection optical system configured to project a pattern of the reticle onto a substrate, a measuring apparatus configured to measure a shape of a surface of one of the substrate and a resist applied on the substrate, and a stage configured to correct a position of the substrate based on the measurement result obtained by the measuring apparatus, wherein the measuring apparatus includes the above measuring apparatus.

According to the fourth aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

BRIEF DESCRIPTION OF THE DRAWINGS

FIG. 12 is a graph showing interference signals obtained by scanning the measurement target object in a direction perpendicular to its surface via an actuator in the conventional measuring apparatus shown in FIG. 11.

FIG. 13 is a graph showing the aberration amount with respect to the wavelength in an optical system formed from lenses.

FIG. 14 is a graph showing interference signals obtained by widening the wavelength range of light which irradiates the measurement target object and scanning the measurement target object in a direction perpendicular to its surface in the conventional measuring apparatus shown in FIG. 11.

FIG. 15 is a schematic view showing still another arrangement of the measuring apparatus according to one aspect of the present invention.

DESCRIPTION OF THE EMBODIMENTS

Figure 1:
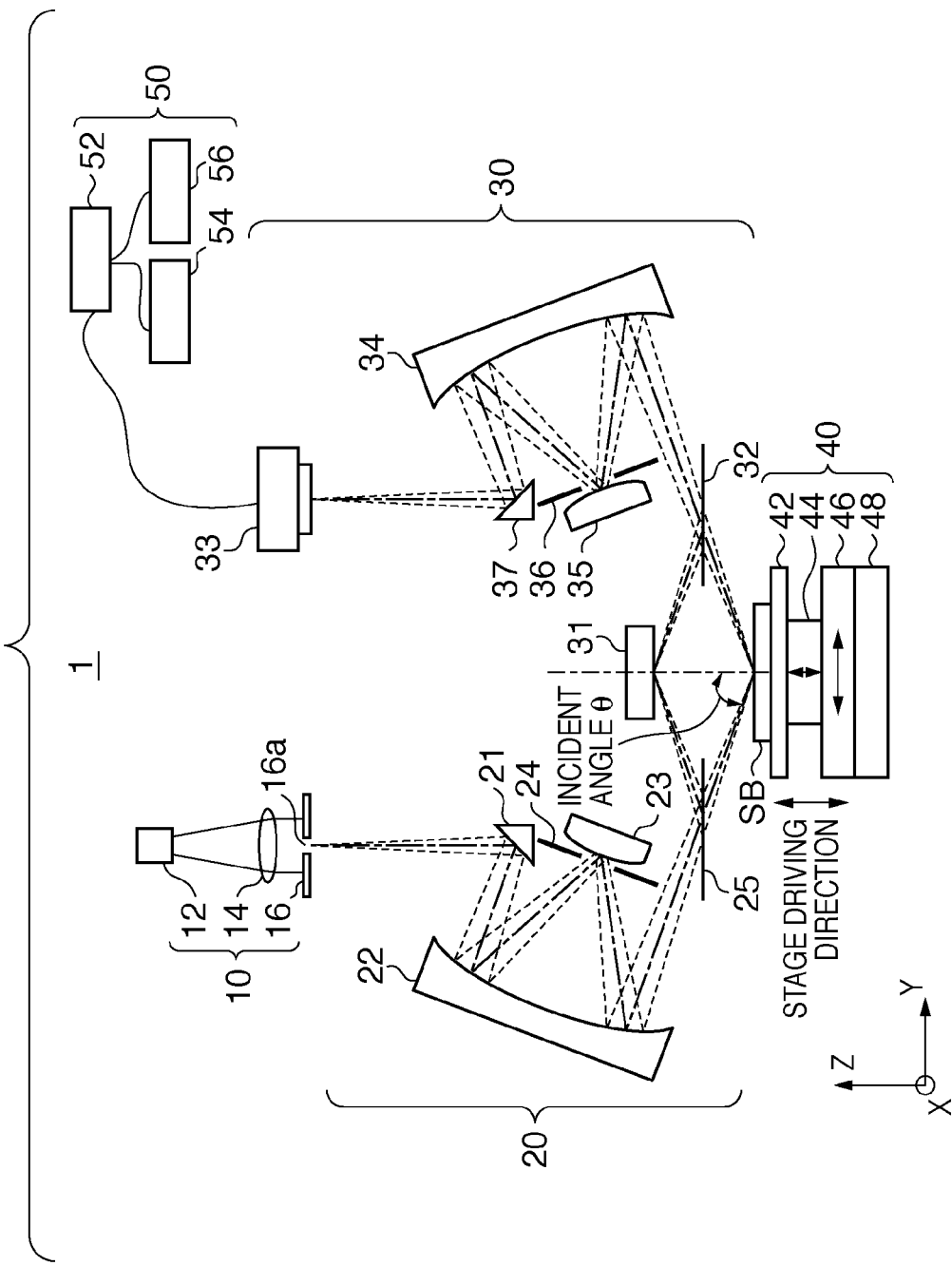
FIG. 1 is a schematic view showing the arrangement of a measuring apparatus according to one aspect of the present invention.

A preferred embodiment of the present invention will be described below with reference to the accompanying drawings. The same reference numerals denote the same members throughout the drawings, and a repetitive description thereof will not be given.

FIG. 1 is a schematic view showing the arrangement of a measuring apparatus 1 according to one aspect of the present invention. The measuring apparatus 1 measures the height information (Z position) of a substrate SB as the measurement target object at each point on the X-Y plane, and the average height information and average tilt information ($\omega x$ and $\omega y$) of a predetermined region on the substrate SB. In other words, the measuring apparatus 1 measures the surface shape of the substrate SB as the measurement target object. When a plurality of thin films are formed on the substrate SB, the measuring apparatus 1 also measures the height information of the uppermost thin-film surface, the interface between each adjacent pair of thin films, or the substrate SB. Note that the substrate SB in this embodiment is a wafer onto which the pattern of a reticle is transferred in an exposure apparatus.

The measuring apparatus 1 includes an illumination optical system 10, light projecting optical system 20, light receiving optical system 30, stage system 40, and data processing system 50, as shown in FIG. 1.

The illumination optical system 10 includes a light source 12, condenser lens 14, and slit plate 16.

In this embodiment, the light source 12 is an LED (e.g., a white light LED) which emits light in a wide wavelength range or a halogen lamp. However, the light source 12 may be formed by combining a plurality of lasers having different light-emitting wavelengths in a narrow wavelength range. In this embodiment, the wavelength range of the light from the light source 12 is 100 nm or more and, more specifically, 400 nm to 800 nm. When the substrate SB is coated with a resist, the substrate SB is preferably not irradiated with light in a wavelength range that falls below that of ultraviolet light (350 nm) to prevent exposure of the resist. In this embodiment, the polarization state of the light from the light source 12 is non-polarization or circular polarization. The condenser lens 14 converges the light from the light source 12. The slit plate 16 is a member for guiding the light from the light source 12 to the substrate SB.

The light projecting optical system 20 includes a plane mirror 21 for deflecting the direction in which the light from the illumination optical system 10 travels, a concave surface mirror 22 having a certain optical power, a convex surface mirror 23 having a certain optical power, an aperture stop 24, and a beam splitter 25 for splitting the light. However, if a space sufficient to accommodate the illumination system can be ensured, the plane mirror 21 need not always be used. Also, the reflection region on the convex surface mirror 23 may be limited using, for example, a reflection film or anti-reflection film in place of the aperture stop 24. Note that "a given member has a certain optical power" means herein that "the optical power (the reciprocal of the focal length) of that member is non-zero" and, for example, "a mirror having a certain optical power" does not include a "plane mirror".

The concave surface mirror 22 and convex surface mirror 23 form an imaging optical system in the light projecting optical system 20, and determine the magnification of the light projecting optical system 20. In this embodiment, the concave surface mirror 22 and convex surface mirror 23 are arranged such that the center of curvature of the concave surface mirror 22 matches that of the convex surface mirror 23 (they have a concentric circle). In other words, the concave surface mirror 22 and convex surface mirror 23 are arranged to form a so-called Offner configuration. However, the concave surface mirror 22 and convex surface mirror 23 may be arranged such that the center of curvature of the concave surface mirror 22 does not match that of the convex surface mirror 23 (they have no concentric circle) by setting the convex curvature of the convex surface mirror 23 to double the concave curvature of the concave surface mirror 22 (i.e., convex curvature=2 (concave curvature)).

The beam splitter 25 is a prism type beam splitter having a split film formed from a metal film or dielectric multilayer film, or a pellicle type beam splitter formed from a film as thin as about 1 μm to 5 μm (the film material is SiC or SiN).

The light receiving optical system 30 includes a reference mirror 31, a beam splitter 32 for combining a light component reflected by the reference mirror 31 and that reflected by the substrate SB, and an image sensing device (photoelectric conversion device) 33 formed from a CCD or CMOS. The light receiving optical system 30 also includes a concave surface mirror 34 having a certain optical power, a convex surface mirror 35 having a certain optical power, an aperture stop 36, and a plane mirror 37 for deflecting the direction in which the light travels. The concave surface mirror 34 and convex surface mirror 35 image the surface of the substrate SB on the image sensing device 33. However, if a space sufficient to accommodate the image sensing device 33 can be ensured, the plane mirror 37 need not always be used. Also, the reflection region on the convex surface mirror 35 may be limited using, for example, a reflection film or anti-reflection film in place of the aperture stop 36. Also, a light amount detection device such as a photodetector may be used in place of the image sensing device 33.

The reference mirror 31 is an aluminum plane mirror having a surface accuracy of about 10 nm to 20 nm, or a glass plane mirror having nearly the same surface accuracy.

The beam splitter 32 is a prism type beam splitter or pellicle type beam splitter, like the beam splitter 25.

The concave surface mirror 34 and convex surface mirror 35 form an imaging optical system in the light receiving optical system 30, and together determine the magnification of the light receiving optical system 30. The concave surface mirror 34 and convex surface mirror 35 are arranged such that the center of curvature of the concave surface mirror 34 matches that of the convex surface mirror 35 (they form an Offner configuration), like the concave surface mirror 22 and convex surface mirror 23 in the light projecting optical system 20. The concave surface mirror 34 and convex surface mirror 35 may be arranged such that the center of curvature of the concave surface mirror 34 does not match that of the convex surface mirror 35 by setting the curvature of the convex surface mirror 35 to double that of the concave surface mirror 34.

The aperture stop 36 is inserted at the pupil position of the imaging optical system formed from the concave surface mirror 34 and convex surface mirror 35, and has a function of defining the numerical aperture (NA) of the imaging optical system. In this embodiment, the aperture of the aperture stop 36 is narrowed down to an NA as low as about sin 0.1° to sin 5°.

The stage system 40 serves as a driving unit which drives the substrate SB as the measurement target object. The stage system 40 includes a substrate chuck 42 for holding the substrate SB, and a Z stage 44, Y stage 46, and X stage 48 for aligning the position of the substrate SB as the measurement target object.

The data processing system 50 includes an arithmetic processing unit 52, a storage unit 54 for storing data, and a display unit 56 for displaying, for example, the measurement result obtained by the measuring apparatus 1 and its measurement conditions.

The operation of the measuring apparatus 1, the functions of the constituent elements of the measuring apparatus 1, and the like will be explained in detail below.

Referring to FIG. 1, light from the light source 12 converges on the slit plate 16 via the condenser lens 14. In this embodiment, the slit plate 16 includes a rectangular transparent region 16a having a slit width of 50 μm and a dimension (X direction) of 700 μm. Images of the transparent region 16a are formed on the substrate SB and reference mirror 31 via the concave surface mirror 22 and convex surface mirror 23 which form an imaging optical system. However, the transparent region 16a on the slit plate 16 is not particularly limited to a rectangular shape (slit), and may have a circular shape (pinhole). The transparent region 16a on the slit plate 16 may be formed such that its size changes in accordance with a required measurement region. The transparent region 16a on the slit plate 16 may be made of a transparent member or may be a rectangular opening.

The principal ray of the light having passed through the concave surface mirror 22 and convex surface mirror 23 enters the substrate SB at an incident angle θ. Because the beam splitter 25 is inserted in the optical path between the concave surface mirror 22 and the substrate SB, almost half the light having passed through the concave surface mirror 22 and convex surface mirror 23 is reflected by the beam splitter 25 and enters the reference mirror 31 at the incident angle θ. A light component transmitted through the beam splitter 25 (i.e., a light component which enters the substrate SB as the measurement target object) will be referred to as measurement light, and a light component reflected by the beam splitter 25 (i.e., a light component which enters the reference mirror 31) will be referred to as reference light hereinafter.

As the incident angle θ of the measurement light which enters the substrate SB increases, the reflectance of the upper surface of the thin film (resist) applied on the substrate SB becomes higher than that of the lower surface of the thin film. In view of this, a larger incident angle θ is preferable for measuring the surface shape of the thin film applied on the substrate SB. However, as the incident angle θ becomes close to 90°, an optical system becomes hard to assemble. Therefore, the incident angle θ is preferably 70° to 85°.

The measurement light which has been transmitted through the beam splitter 25 and entered the substrate SB enters the beam splitter 32 upon being reflected by the substrate SB. On the other hand, the reference light which has been reflected by the beam splitter 25 and entered the reference mirror 31 enters the beam splitter 32 upon being reflected by the reference mirror 31.

The measurement light reflected by the substrate SB and the reference light reflected by the reference mirror 31 are combined by the beam splitter 32, and the combined light is received by the image sensing device 33. The convex surface mirror 35 and aperture stop 36 are inserted in the optical path between the beam splitter 32 and the image sensing device 33. The concave surface mirror 34 and convex surface mirror 35 form a bilateral telecentric imaging optical system, which images the surface of the substrate SB on the light receiving surface of the image sensing device 33. In this embodiment, therefore, the transparent region 16a on the slit plate 16 is imaged on the substrate SB and reference mirror 31 by the concave surface mirror 22 and convex surface mirror 23, and is imaged on the light receiving surface of the image sensing device 33 by the concave surface mirror 34 and convex surface mirror 35 again. On the light receiving surface of the image sensing device 33, the measurement light and reference light are superposed on each other to form an interference pattern.

A method of obtaining an interference signal based on an interference pattern formed on the light receiving surface of the image sensing device 33 will be explained herein. The substrate SB is arranged on the Z stage 44, Y stage 46, and X stage 48 while being held by the substrate chuck 42, as described above. To obtain by the image sensing device 33 an interference signal based on an interference pattern formed by the measurement light and reference light, the Z stage 44 need only be driven. To change the measurement region on the substrate SB, the substrate SB is aligned using the X stage 48 or Y stage 46 so that a desired region is positioned in the light receiving region on the image sensing device 33. To control the positions of the X stage 48, Y stage 46, and Z stage 44 with high accuracy, laser interferometers need only be set for five axes, that is, the X-, Y-, and Z-axes and the tilt axes $\omega x$ and $\omega y$. Closed-loop control based on the outputs from these laser interferometers makes it possible to measure the surface shape of the substrate SB with a higher accuracy. Particularly when the entire shape of the substrate SB is obtained by dividing the substrate SB into a plurality of regions and measuring the surface shape of each region, the use of laser interferometers allows to more precisely concatenate (stitch) the shape data.

When a one-dimensional line sensor or two-dimensional sensor is used as the image sensing device 33 in place of a light amount detection device such as a photodetector, the area of the measurement region on the substrate SB that can be measured at once increases. This makes it possible to shorten the time taken to measure the entire shape of the substrate SB. Note that the one-dimensional sensor includes, for example, a photodetector array, CCD line sensor, and CMOS line sensor. Note also that the two-dimensional sensor includes, for example, a two-dimensional CCD and two-dimensional CMOS.

Figure 2:
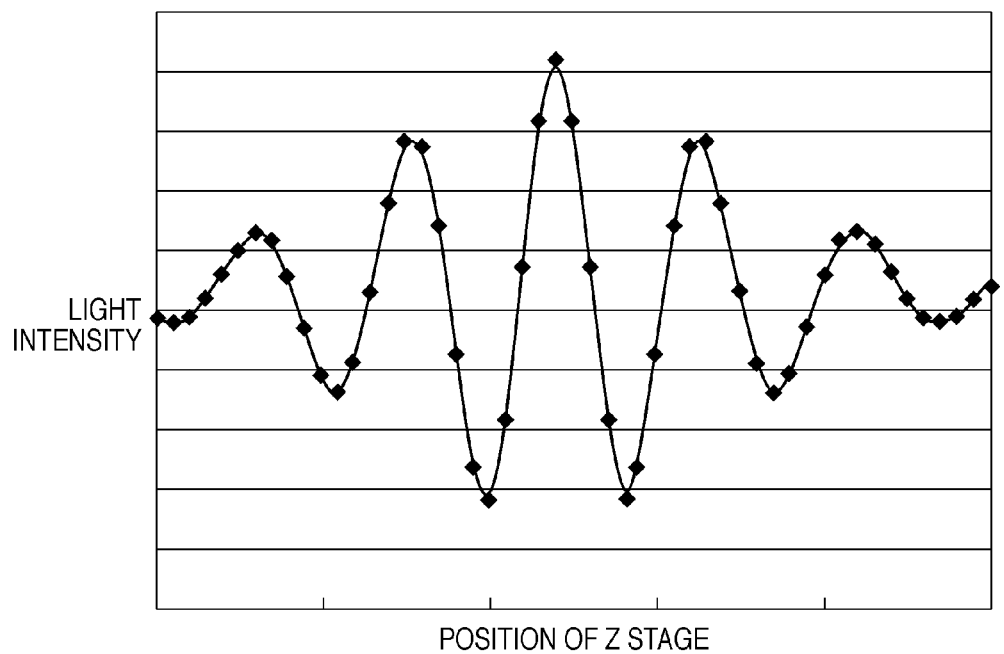
FIG. 2 is a graph showing an interference signal (white light interference signal) obtained by an image sensing device of the measuring apparatus shown in FIG. 1.

Processing of calculating the surface shape of the substrate SB based on the interference signal obtained by the image sensing device 33 will be explained next. This processing is executed by the arithmetic processing unit 52 of the data processing system 50. The surface shape of the substrate SB, which is calculated by the arithmetic processing unit 52, is stored in the storage unit 54 and displayed on the display unit 56. FIG. 2 is a graph showing an interference signal (white light interference signal) obtained by the image sensing device 33. The interference signal shown in FIG. 2 is also called an interferogram. In FIG. 2, the abscissa indicates the position of the Z stage 44 (more specifically, the measurement value obtained by a Z-axis length measurement interferometer or capacitance sensor), and the ordinate indicates the output from the image sensing device 33 (light intensity). The interference signal obtained by the image sensing device 33 is stored in the storage unit 54 of the data processing system 50.

The position of the Z stage (the measurement value obtained by the Z-axis length measurement interferometer) corresponding to the signal peak position calculated from the interference signal shown in FIG. 2 is the height of the substrate SB in the measurement region. The use of a two-dimensional sensor as the image sensing device 33 allows measurement of the three-dimensional shape of the substrate SB. To calculate the signal peak position of the interference signal, the interference signal need only be approximated by a curve (e.g., a quadratic function) based on data on the signal peak position and several points in its neighborhood. This makes it possible to calculate the signal peak position with a resolution of about $1/10$ to $1/50$ a sampling pitch Zp of the abscissa (the position of the Z stage 44) in FIG. 2. The sampling pitch Zp is determined as a constant pitch at which the Z stage 44 is actually driven step by step. However, from the viewpoint of a high-speed operation, it is preferable to drive the Z stage 44 at a constant velocity and acquire the output from the Z-axis length measurement interferometer (the position of the Z stage 44) in synchronism with the acquisition timing of the image sensing device 33.

To calculate the signal peak position of the interference signal, it is also possible to use an FDA method disclosed in U.S. Pat. No. 5,398,113. The FDA method calculates the peak position of the contrast using the phase gradient of a Fourier spectrum.

In this manner, the factors that determine the resolution and accuracy in the white light interference scheme are associated with the calculation precision of a position at which the difference in optical path length between the measurement light and the reference light is zero. Hence, a method of calculating the envelope of an interference pattern by the phase shift method or Fourier transform method and calculating, from its maximum contrast position, a position at which the difference in optical path length is zero, the zero phase crossing method, or the like can also be used to calculate the signal peak position of the interference signal.

Since the measuring apparatus 1 uses the concave surface mirror 22 and convex surface mirror 23 as the imaging optical system of the light projecting optical system 20, and uses the concave surface mirror 34 and convex surface mirror 35 as the imaging optical system of the light receiving optical system 30, the adverse influences of the aberrations (especially, chromatic aberrations) of these imaging optical systems can be reduced. Also, since the measuring apparatus 1 does not use lenses unlike the prior arts, the adverse influence of a change in spectroscopic characteristics attributed to the transmittance of a glass material can be reduced. Hence, the measuring apparatus 1 can measure the surface shape of the substrate SB as the measurement target object with high accuracy.

Although the substrate SB is driven without driving the reference mirror 31 (i.e., while fixing the reference mirror 31) in this embodiment, an interference signal can be obtained even by driving the reference mirror 31 without driving the substrate SB (i.e., while fixing the substrate SB). However, an interference signal can also be obtained even without driving the reference mirror 31 or substrate SB, as disclosed in U.S. Pre-Grant Publication No. 2007/0086013. In this case, by inserting a spectroscopic device at the preceding stage of the image sensing device 33 and detecting the intensity of an interference pattern for each wavelength by the image sensing device 33, the position of the substrate SB in the Z direction can be calculated based on the intensity of the interference signal for each wavelength.

Figure 3:
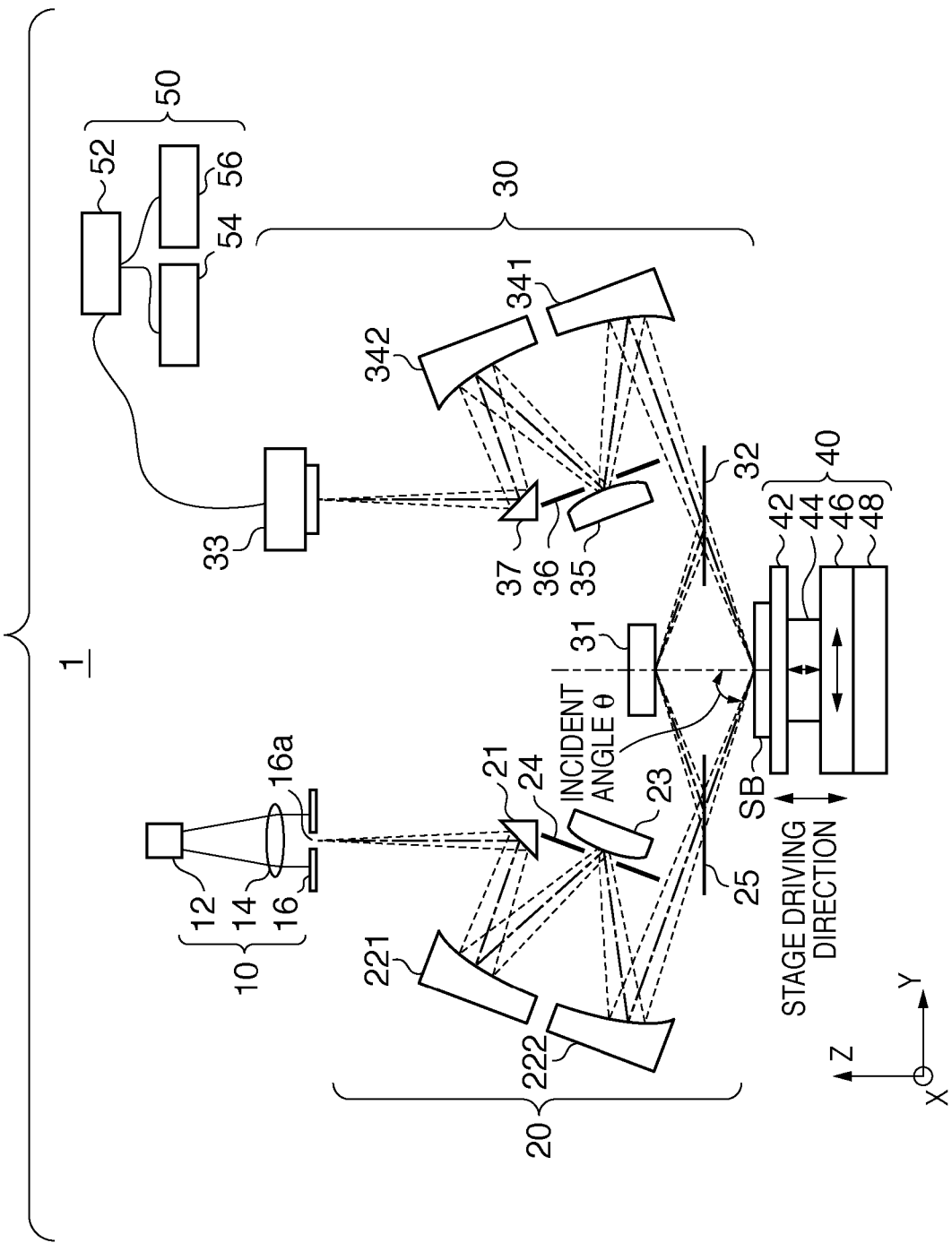
FIG. 3 is a schematic view showing another arrangement of the measuring apparatus according to one aspect of the present invention.

Another arrangement of the measuring apparatus 1 will be explained below with reference to FIG. 3. FIG. 3 is a schematic view showing another arrangement of the measuring apparatus 1 according to one aspect of the present invention.

The measuring apparatus 1 shown in FIG. 3 is similar to that shown in FIG. 1, but is different from it in the arrangements of the light projecting optical system 20 and light receiving optical system 30. More specifically, the measuring apparatus 1 shown in FIG. 3 uses concave surface mirrors 221 and 222 obtained by dividing the concave surface mirror 22 in the light projecting optical system 20, and uses concave surface mirrors 341 and 342 obtained by dividing the concave surface mirror 34 in the light receiving optical system 30.

When the curvatures of the concave surface mirrors 221 and 222 in the light projecting optical system 20 are set different from each other, their focal lengths can be changed. This makes it possible to change the magnification of the light projecting optical system 20. For example, a plurality of sets of concave surface mirrors 221 and 222 having different curvatures are exchangeably inserted in the light projecting optical system 20 so that one of them is selected in accordance with the magnification of the light projecting optical system 20. With this operation, the magnification of the light projecting optical system 20 becomes variable. This makes it possible to change the measurement region on the substrate SB by changing the magnification of a measurement mark projected onto the substrate SB.

Likewise, when the curvatures of the concave surface mirrors 341 and 342 in the light receiving optical system 30 are set different from each other, their focal lengths can be changed. This makes it possible to change the magnification of the light receiving optical system 30. For example, a plurality of sets of concave surface mirrors 341 and 342 having different curvatures are exchangeably inserted in the light receiving optical system 30 so that one of them is selected in accordance with the magnification of the light receiving optical system 30. With this operation, the magnification of the light receiving optical system 30 becomes variable. This makes it possible to change the amount of light reception by the image sensing device 33 by changing the magnification of a measurement mark imaged on the image sensing device 33. It is therefore possible to improve the S/N ratio of the image sensing device 33.

Moreover, changing the magnification of the light projecting optical system 20 or light receiving optical system 30 makes it possible to widen the measurement region on the substrate SB, thus improving the resolution on the substrate SB in the X and Y directions.

Figure 4:
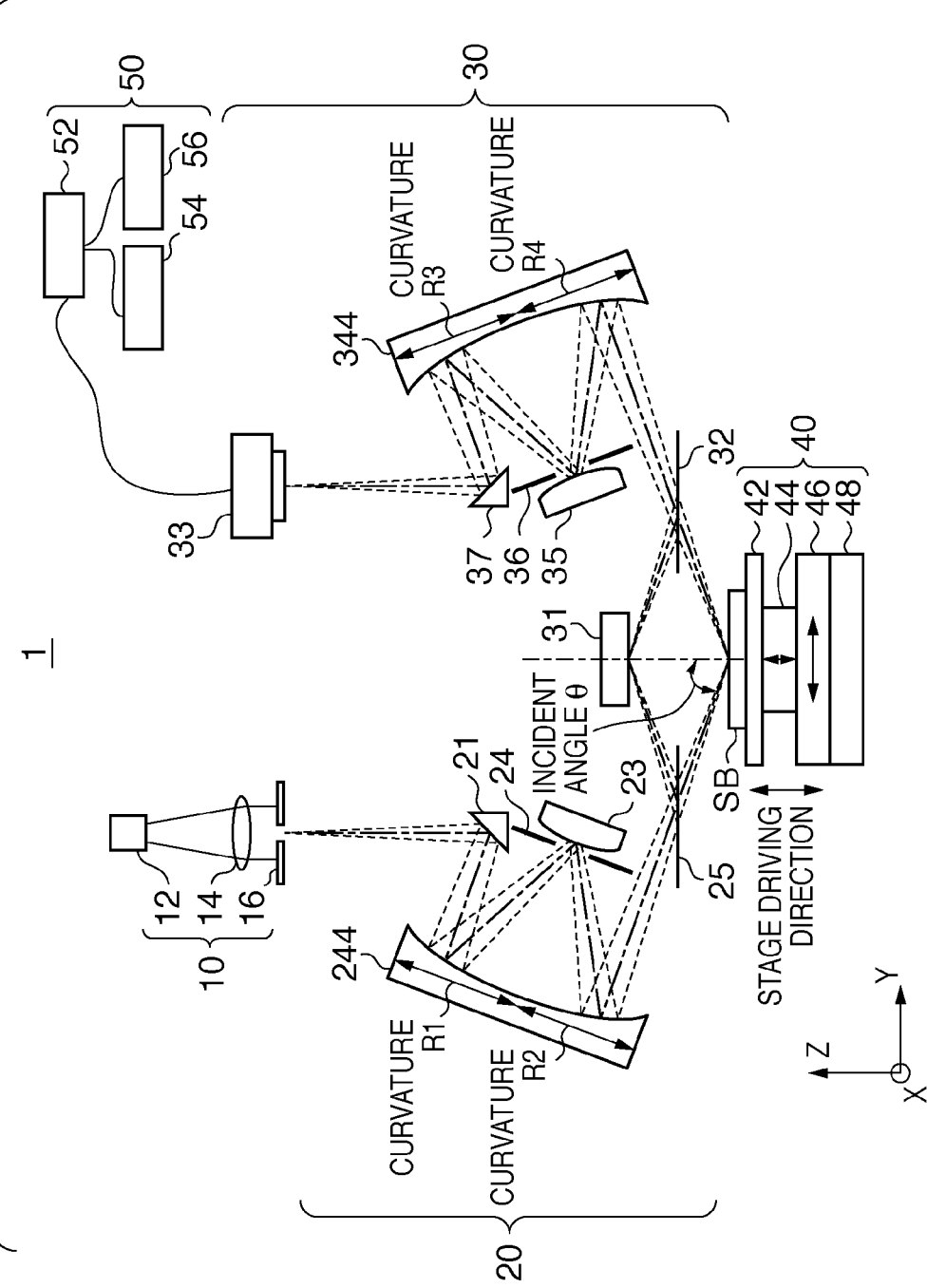
FIG. 4 is a schematic view showing still another arrangement of the measuring apparatus according to one aspect of the present invention.

Still another arrangement of the measuring apparatus 1 will be explained below with reference to FIG. 4. FIG. 4 is a schematic view showing still another arrangement of the measuring apparatus 1 according to one aspect of the present invention.

The measuring apparatus 1 shown in FIG. 4 is similar to that shown in FIG. 1, but is different from it in the arrangements of the light projecting optical system 20 and light receiving optical system 30. More specifically, the measuring apparatus 1 shown in FIG. 4 substitutes a concave surface mirror 224 having different partial curvatures R1 and R2 for the concave surface mirror 22 in the light projecting optical system 20, and substitutes a concave surface mirror 344 having different partial curvatures R3 and R4 for the concave surface mirror 34 in the light receiving optical system 30. In other words, the concave surface mirrors 224 and 344 have two or more portions having different curvatures. Concave surface mirrors 224 and 344 in each of which the curvature is partially changed can be fabricated using, for example, grinding or molding.

When the curvatures R1 and R2 are set different from each other in the concave surface mirror 224 of the light projecting optical system 20, the magnification of the light projecting optical system 20 can be changed. For example, a plurality of concave surface mirrors 224 each with two or more portions having different curvatures are exchangeably inserted in the light projecting optical system 20 so that one of them is selected in accordance with the magnification of the light projecting optical system 20. With this operation, the magnification of the light projecting optical system 20 becomes variable. This makes it possible to change the measurement region on the substrate SB by changing the magnification of a measurement mark projected onto the substrate SB.

Likewise, when the curvatures R3 and R4 are set different from each other in the concave surface mirror 344 of the light receiving optical system 30, the magnification of the light receiving optical system 30 can be changed. For example, a plurality of concave surface mirrors 344 each with two or more portions having different curvatures are exchangeably inserted in the light receiving optical system 30 so that one of them is selected in accordance with the magnification of the light receiving optical system 30. With this operation, the magnification of the light receiving optical system 30 becomes variable. This makes it possible to change the amount of light reception by the image sensing device 33 by changing the magnification of a measurement mark imaged on the image sensing device 33. It is therefore possible to improve the S/N ratio of the image sensing device 33.

Moreover, changing the magnification of the light projecting optical system 20 or light receiving optical system 30 makes it possible to widen the measurement region on the substrate SB, thus improving the resolution on the substrate SB in the X and Y directions.

Still another arrangement of the measuring apparatus 1 will be explained below with reference to FIG. 15. FIG. 15 is a schematic view showing still another arrangement of the measuring apparatus 1 according to one aspect of the present invention.

The measuring apparatus 1 shown in FIG. 15 is similar to that shown in FIG. 1, but is different from it in the arrangements of the light projecting optical system 20 and light receiving optical system 30. More specifically, the light projecting optical system 20 and light receiving optical system 30 are formed such that the slit plate 16 and image sensing device 33 become optically conjugate to each other (have an imaging relationship). The substrate SB and reference mirror 31 are inserted on the pupil plane of an imaging optical system formed from the light projecting optical system 20 and light receiving optical system 30. That is, the light projecting optical system 20 is formed as a Fourier transform optical system such that the positions of the slit plate 16 and substrate SB (reference mirror) have an optical Fourier transform relationship. Also, the light receiving optical system 30 is formed as a Fourier transform optical system such that the positions of the image sensing device 33 and substrate SB (reference mirror) have an optical Fourier transform relationship. Forming the light receiving optical system 30 in this way makes it possible to measure the average height of the surface of the substrate SB. Also, forming the light projecting optical system 20 and light receiving optical system 30 in this way makes it possible to decreases the number of optical members, thus decreasing costs.

The light projecting optical system 20 alone may be a Fourier transform optical system while the light receiving optical system 30 is the imaging optical system as shown in FIG. 1. Alternatively, the light receiving optical system 30 alone may be a Fourier transform optical system while the light projecting optical system 20 is the imaging optical system as shown in FIG. 1. Even this arrangement can decrease the number of optical members, thus decreasing costs.

Figure 5:
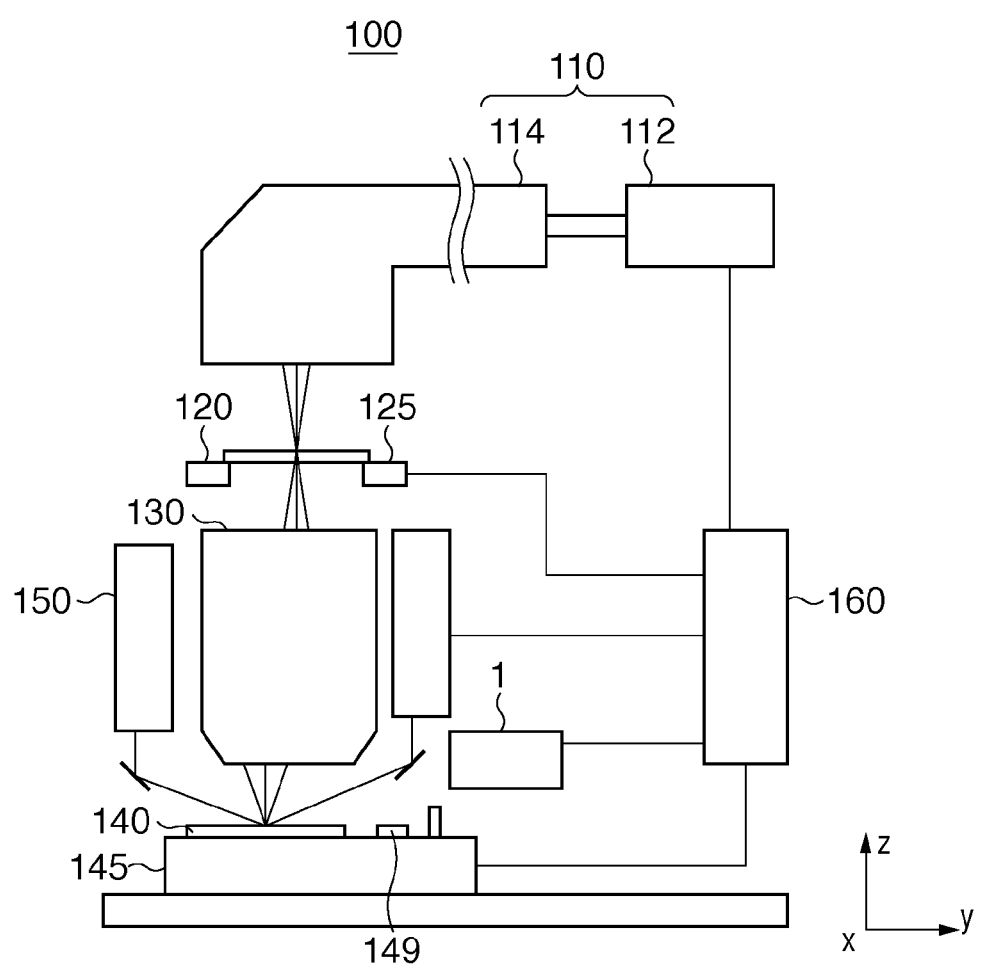
FIG. 5 is a schematic view showing the arrangement of an exposure apparatus according to one aspect of the present invention.

An exposure apparatus 100 including the measuring apparatus 1 according to the present invention will be explained next with reference to FIG. 5. FIG. 5 is a schematic view showing the arrangement of the exposure apparatus 100 according to one aspect of the present invention.

In this embodiment, the exposure apparatus 100 is a projection exposure apparatus which transfers the pattern of a reticle 120 onto a wafer 140 by exposure using the step & scan scheme. However, the exposure apparatus 100 can adopt the step & repeat scheme or another exposure scheme.

The exposure apparatus 100 includes an illumination apparatus 110, a reticle stage 125 for mounting the reticle 120, a projection optical system 130, a wafer stage 145 for mounting the wafer 140, a focus control sensor 150, and a control unit 160, as shown in FIG. 5.

The illumination apparatus 110 illuminates the reticle 120 on which a pattern to be transferred is formed, and includes a light source 112 and illumination optical system 114.

The light source 112 is, for example, an ArF excimer laser having a wavelength of about 193 nm or a KrF excimer laser having a wavelength of about 248 nm. However, the light source 112 is not particularly limited to an excimer laser, and may be an F2 laser having a wavelength of about 157 nm or the one which uses EUV (Extreme UltraViolet) light having a wavelength of 20 nm or less.

The illumination optical system 114 illuminates the reticle 120 with light from the light source 112. In this embodiment, the illumination optical system 114 forms an exposure slit having a shape best suited to exposure. The illumination optical system 114 includes, for example, a lens, mirror, optical integrator, and stop.

The reticle 120 has a pattern to be transferred and is supported and driven by the reticle stage 125. Diffracted light generated by the reticle 120 is projected onto the wafer 140 via the projection optical system 130. The reticle 120 and wafer 140 are arranged to have an optically conjugate relationship. The exposure apparatus 100 includes a reticle detection unit of the oblique incidence system (not shown). The position of the reticle 120 is detected by the reticle detection unit, and it is arranged at a predetermined position.

The reticle stage 125 supports the reticle 120 via a reticle chuck (not shown), and is connected to a moving mechanism (not shown). The moving mechanism is formed from, for example, a linear motor and drives the reticle stage 125 in the X-, Y-, and Z-axis directions and the rotation directions about the respective axes.

The projection optical system 130 projects the pattern of the reticle 120 onto the wafer 140. The projection optical system 130 can be a dioptric system, catadioptric system, or catoptric system.

The wafer 140 is a substrate onto which the pattern of the reticle 120 is projected (transferred), and is supported and driven by the wafer stage 145. However, a glass plate or another substrate can be used in place of the wafer 140. The wafer 140 is coated with a resist.

The wafer stage 145 supports the wafer 140 via a wafer chuck (not shown). The wafer stage 145 moves the wafer 140 in the X-, Y-, and Z-axis directions and the rotation directions about the respective axes using a linear motor, like the reticle stage 125. A reference plate 149 is also arranged on the wafer stage 145.

The focus control sensor 150 has a function of measuring the shape of the wafer 140, like the measuring apparatus 1. The focus control sensor 150 has a good response characteristic but is more likely to generate a detection error attributed to the wafer pattern.

The measuring apparatus 1 can take any of the above-described forms, and a detailed description thereof will not be given herein. The measuring apparatus 1 has a poor response characteristic but is less likely to generate a detection error attributed to the wafer pattern.

The control unit 160 includes a CPU and memory and controls the operation of the exposure apparatus 100. In this embodiment, the control unit 160 serves as a data processing system of the focus control sensor 150. Hence, the control unit 160 performs arithmetic correction processing and control of the measurement value obtained by measuring the surface position of the wafer 140 by the focus control sensor 150. The control unit 160 may also serve as the data processing system 50 of the measuring apparatus 1.

Measurement points for the surface position (focus) of the wafer 140 will be explained herein. In this embodiment, the surface shape of the wafer 140 is measured by the focus control sensor 150 while scanning the wafer stage 145 in the scanning direction (Y-axis direction) over the entire surface of the wafer 140. The profile of the entire surface of the wafer 140 is measured by repeating an operation of stepping the wafer stage 145 by ΔX in a direction (X-axis direction) perpendicular to the scanning direction and measuring the surface position of the wafer 140 in the scanning direction. The surface positions of different regions on the wafer 140 may be measured at once using a plurality of focus control sensors 150. This makes it possible to improve the throughput.

In this embodiment, the focus control sensor 150 uses an optical height measuring system. More specifically, the focus control sensor 150 applies light onto the surface of the wafer 140 at a large incident angle, and detects an image shift of the light, which is reflected by the surface of the wafer 140, by a light receiving device such as a CCD. The focus control sensor 150 applies light beams at a plurality of measurement points on the wafer 140, receives the light beams, which are reflected at these measurement points, by individual light receiving devices, and calculates the tilt of the surface to be exposed from the height information at different positions.

Figure 6:
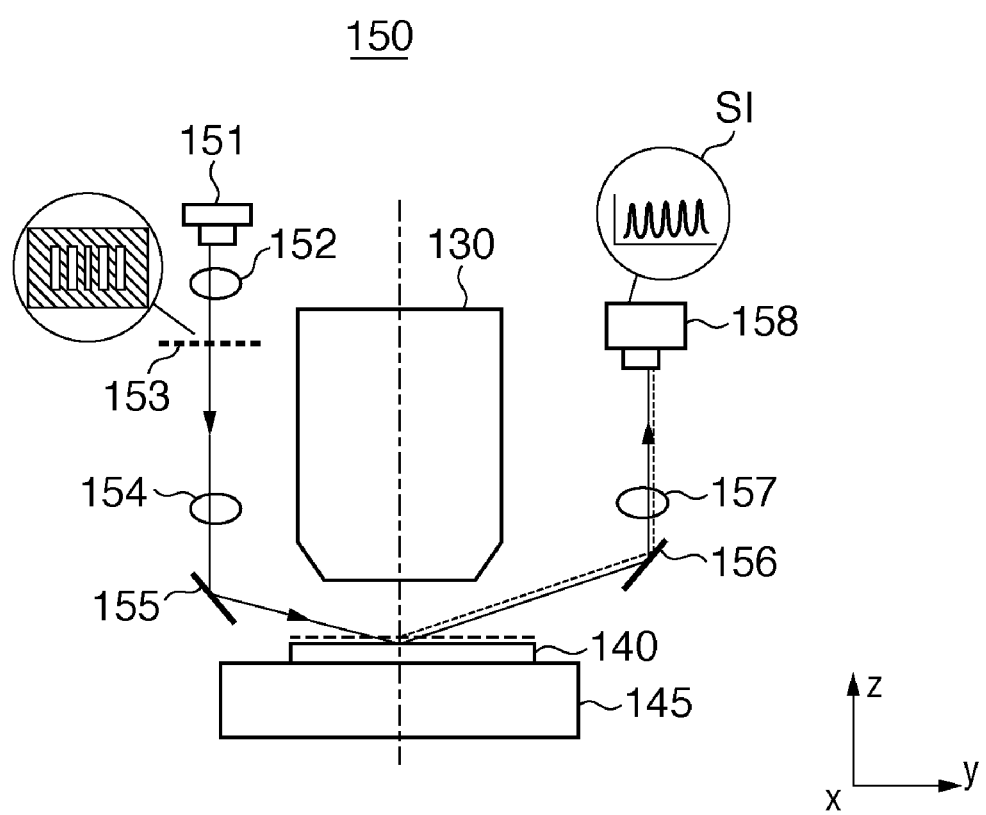
FIG. 6 is a schematic view showing the arrangement of a focus control sensor of the exposure apparatus shown in FIG. 5.

The focus control sensor 150 will be explained in detail with reference to FIG. 6. FIG. 6 is a schematic view showing the arrangement of the focus control sensor 150. The focus control sensor 150 includes a light source 151, a condenser lens 152, a pattern plate 153 having a plurality of transparent slits formed on it, a lens 154, and a mirror 155, as shown in FIG. 6. The focus control sensor 150 also includes a mirror 156, a lens 157, and a light receiving device 158 such as a CCD.

Light from the light source 151 is converged on the pattern plate 153 via the condenser lens 152 and illuminates the pattern plate 153. The light having passed through the transparent slits of the pattern plate 153 enters the wafer 140 at a predetermined angle via the lens 154 and mirror 155. Since the pattern plate 153 and wafer 140 have an imaging relationship via the lens 154, an aerial image of each transparent slit of the pattern plate 153 is formed on the wafer 140.

The light reflected by the wafer 140 is received by the light receiving device 158 via the mirror 156 and lens 157, thereby obtaining a signal SI formed from the slit images corresponding to the respective transparent slits of the pattern plate 153, as shown in FIG. 6. Detecting a positional shift of the signal SI on the light receiving device 158 makes it possible to measure the position of the wafer 140 in the Z direction. When the surface of the wafer 140 changes from a position w1 to a position w2, an amount of optical axis shift m1 on the wafer 140 is given by:

$$m1 = 2 \cdot dZ \cdot \tan \theta_{in} \quad (1)$$

where $\theta_{in}$ is the incident angle, and dZ is the amount of change from the position w1 to the position w2.

For example, if the incident angle $\theta_{in}$ is 84°, m1=19·dZ, which corresponds to a displacement 19 times the actual displacement of the wafer 140. The displacement on the light receiving device 158 is obtained by multiplying the parameter expressed by equation (1) by the magnification of an optical system (i.e., the magnification of the lens 157).

Figure 7:
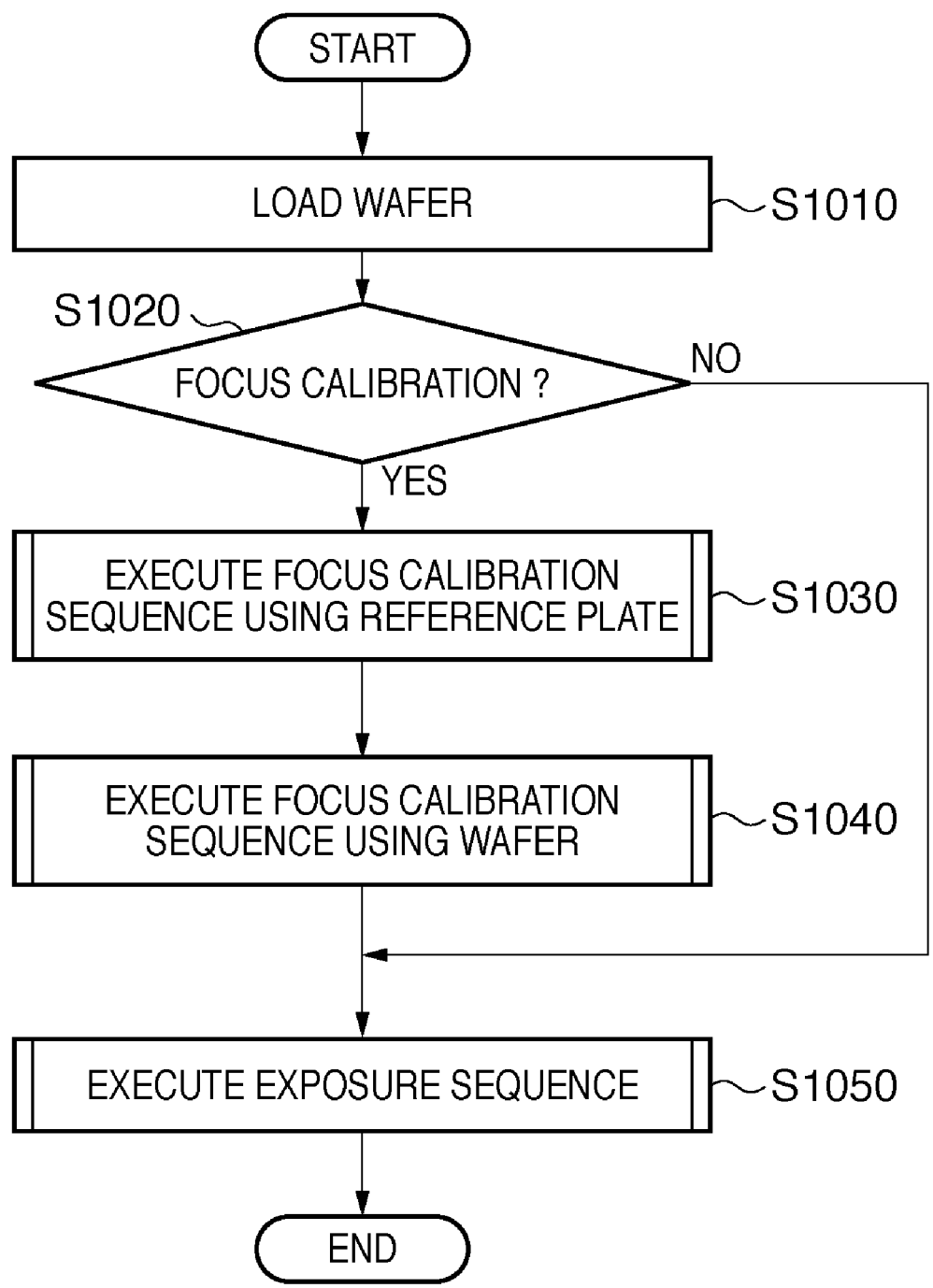
FIG. 7 is a flowchart for explaining the exposure operation of the exposure apparatus shown in FIG. 5.

The exposure operation of the exposure apparatus 100 (an exposure method using the exposure apparatus 100) will be explained below. FIG. 7 is a flowchart for explaining the exposure operation of the exposure apparatus 100.

In step S1010, a wafer 140 is loaded into the exposure apparatus 100.

In step S1020, it is determined whether to perform focus calibration of the focus control sensor 150 for the wafer 140 loaded in step S1010. More specifically, this determination is performed based on pieces of information such as whether the wafer 140 is the first wafer of a lot, whether the wafer 140 is the first wafer of a plurality of lots, and whether the wafer 140 is the one to undergo a process in which a strict focus accuracy is required, which are registered in the exposure apparatus 100 in advance by the user.

If it is determined in step S1020 not to perform focus calibration of the focus control sensor 150, the process advances to step S1050, and an exposure sequence (to be described later) is executed.

If it is determined in step S1020 to perform focus calibration of the focus control sensor 150, the process advances to step S1030, and a focus calibration sequence using the reference plate 149 is executed.

In step S1040, a focus calibration sequence using the wafer 140 is executed.

Figure 8:
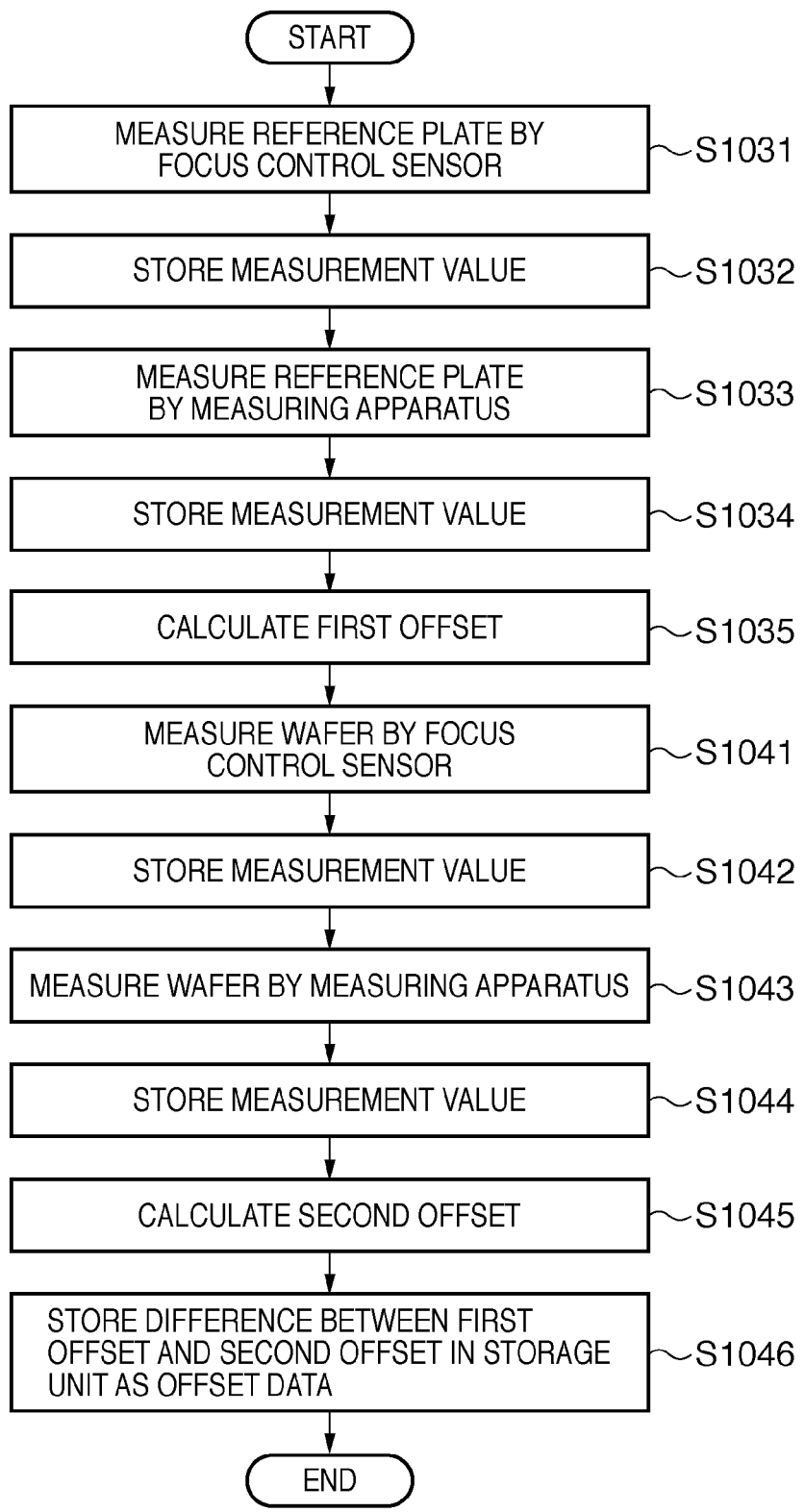
FIG. 8 is a detailed flowchart of focus calibration sequences in steps S1030 and S1040 of FIG. 7.

The focus calibration sequences executed in steps S1030 and S1040 will be explained herein with reference to FIG. 8. FIG. 8 is a detailed flowchart of the focus calibration sequences in steps S1030 and S1040.

In the focus calibration sequence using the reference plate 149, first the wafer stage 145 is driven and aligned so as to position the reference plate 149 below the focus control sensor 150. A glass plate which exhibits good surface accuracy and called an optical flat, or the like is used as the reference plate 149. A uniform region free from any reflectance distribution is provided on the surface of the reference plate 149 so as not to generate any measurement error of the focus control sensor 150, and the focus control sensor 150 measures this region. However, part of a plate in which various calibration marks necessary for other calibration operations of the exposure apparatus 100 (e.g., alignment and evaluation of the projection optical system 130) are formed may be used as the reference plate 149.

In step S1031, the position of the reference plate 149 in the Z direction is measured by the focus control sensor 150.

In step S1032, the position of the reference plate 149 in the Z direction (measurement value Om), which is measured in step S1031, is stored in a storage unit of the exposure apparatus 100 (for example, a memory of the control unit 160).

The wafer stage 145 is driven and aligned so as to position the reference plate 149 below the measuring apparatus 1 next.

In step S1033, the shape of the reference plate 149 is measured by the measuring apparatus 1. Note that the measurement region (X-Y plane) on the reference plate 149, which is to be measured by the measuring apparatus 1, is the same as that measured by the focus control sensor 150 in step S1031.

In step S1034, the shape of the reference plate 149 (measurement value Pm), which is measured in step S1033, is stored in the storage unit.

Figure 9:
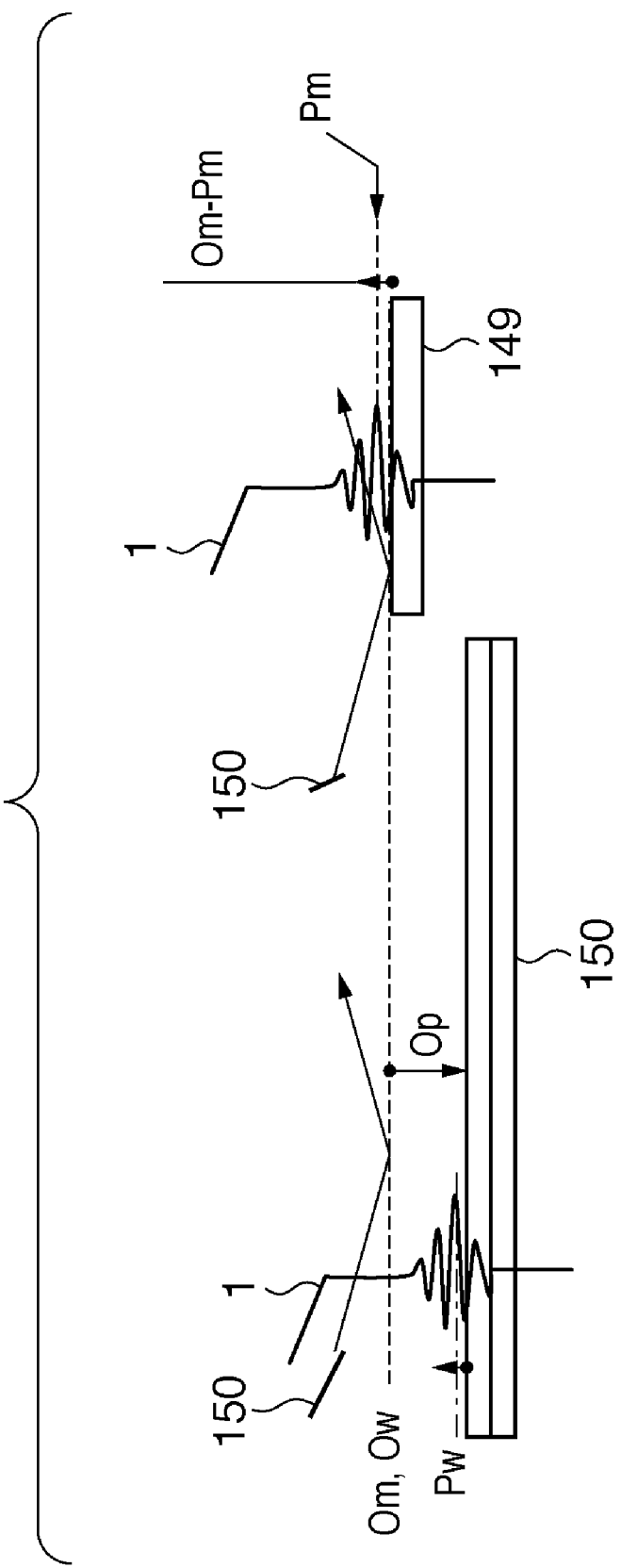
FIG. 9 is a view for explaining a first offset and second offset in the focus calibration sequences.

In step S1035, a first offset is calculated. More specifically, the first offset is calculated as the difference between the measurement value Pm obtained by the measuring apparatus 1 and that Om obtained by the focus control sensor 150, as shown in FIG. 9. Since the first offset is obtained by measuring an optically uniform surface of the reference plate 149, the focus control sensor 150 generates no measurement error and so theoretically the first offset must be zero. In practice, however, the first offset is not zero because of error factors such as a systematic offset of the wafer stage 145 in the scanning direction or a long-term drift of the focus control sensor 150 or measuring apparatus 1. For this reason, the first offset is preferably obtained (calculated) periodically. However, if the above-described error factors are not present or managed separately, the first offset need only be obtained once. Note that FIG. 9 is a view for explaining a first offset and a second offset (to be described later) in the focus calibration sequences.

Steps S1031 to S1035 correspond to the focus calibration sequence using the reference plate 149.

In the focus calibration sequence using the wafer 140, the wafer stage 145 is driven and aligned so as to position the wafer 140 below the focus control sensor 150. A measurement position Wp on the wafer 140 (on the wafer surface) matches that for the exposure sequence (to be described later).

In step S1041, the measurement position Wp on the wafer 140 is measured by the focus control sensor 150, thereby measuring the position of the measurement position Wp in the Z direction.

In step S1042, the position of the measurement position Wp on the wafer 140 (measurement value Ow), which is measured in step S1041, is stored in the storage unit.

The wafer stage 145 is driven and aligned so as to position the measurement position Wp on the wafer 140 below the measuring apparatus 1.

In step S1043, the measurement position Wp on the wafer 140 is measured by the measuring apparatus 1, thereby measuring the shape of the measurement position Wp on the wafer 140.

In step S1044, the shape of the measurement position Wp on the wafer 140 (measurement value Pw), which is measured in step S1043, is stored in the storage unit. Note that the measurement position Wp serving as the measurement point on the wafer 140 can be selected from various modes such as "one point on the wafer", "one point in a certain shot", "all points in a certain shot", "all points in a plurality of shots", and "all points on the wafer".

In step S1045, a second offset is calculated. More specifically, the second offset is calculated for each measurement position Wp on the wafer 140 as the difference between the measurement value Pw obtained by the measuring apparatus 1 and that Ow obtained by the focus control sensor 150, as shown in FIG. 9.

In step S1046, the difference between the first offset and the second offset is calculated for each measurement position Wp on the wafer 140, and the calculated difference is stored in the storage unit as offset data. An amount of offset Op at each measurement position on the wafer 140 can be calculated by:

$$Op(i)=[Ow(i)-Pw(i)]-(Om-Pm) \quad (2)$$

where i is the point number which represents the measurement position on the wafer 140.

As the amount of offset Op, the average height offset (Z) or the average tilt offset ($\omega x$ or $\omega y$) may be stored for each exposure shot (each shot for a stepper, and each exposure slit for a scanner). Since a pattern transferred onto the wafer 140 is repetitively formed in each shot (die), the amount of offset Op may be calculated as the average offset value of the shots on the wafer 140.

Steps S1041 to S1046 correspond to the focus calibration sequence using the wafer 140.

Figure 10:
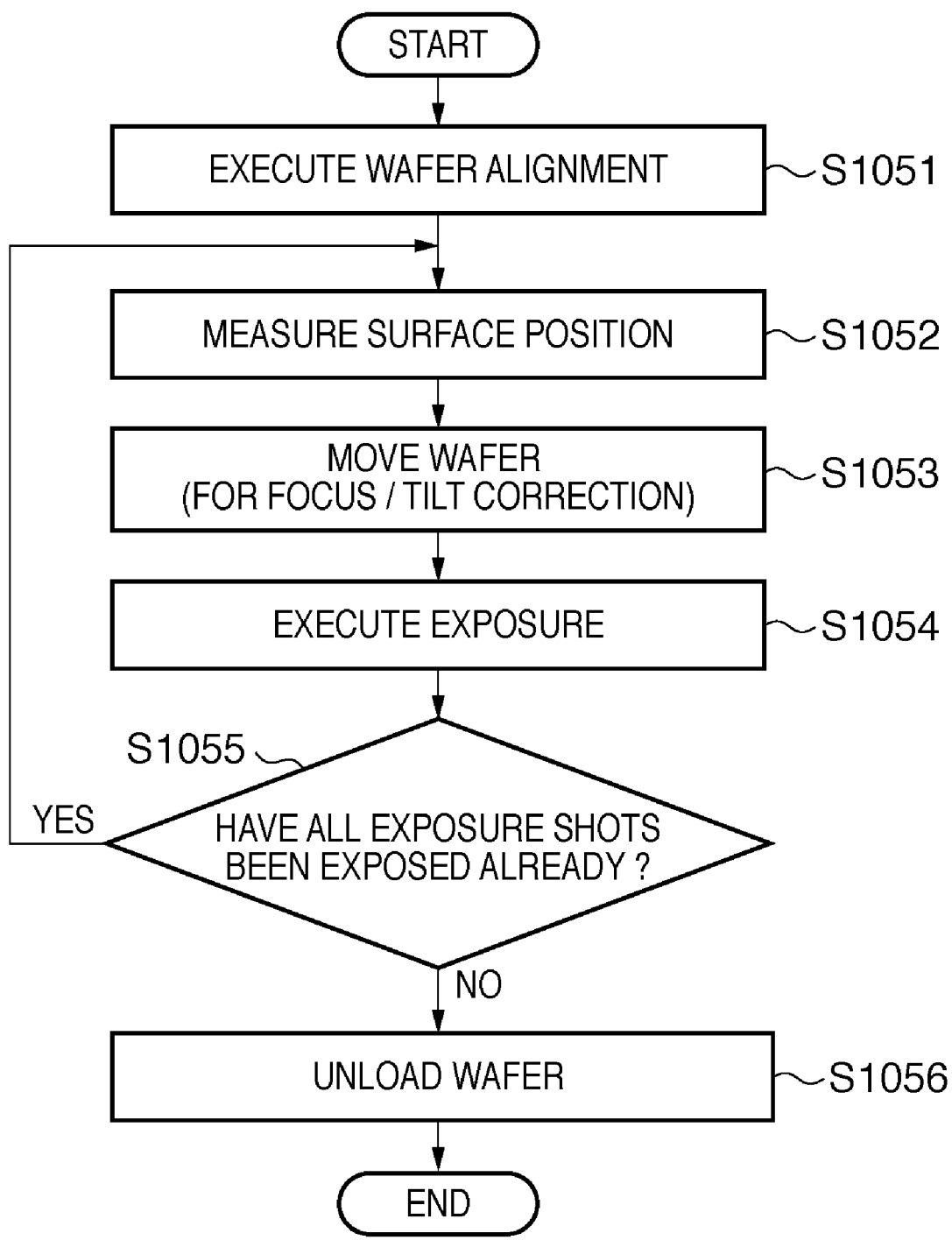
FIG. 10 is a detailed flowchart of an exposure sequence in step S1050 of FIG. 7.
Figure 11:
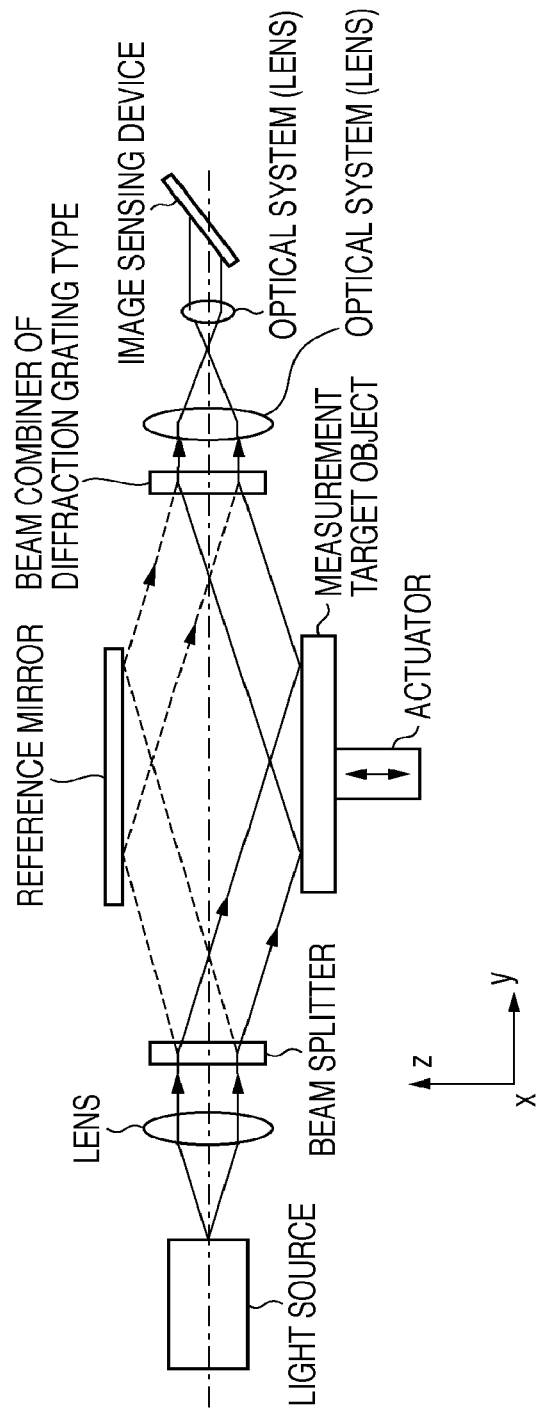
FIG. 11 is a schematic view showing the arrangement of a conventional measuring apparatus which measures the shape of a measurement target object.

An exposure sequence in step S1050 executed after the focus calibration sequences in steps S1030 and S1040 are completed will be explained next with reference to FIG. 10. FIG. 10 is a detailed flowchart of the exposure sequence in step S1050.

In step S1051, wafer alignment is executed. In the wafer alignment, the position of an alignment mark on the wafer 140 is detected by an alignment scope (not shown), and the position of the wafer 140 on the X-Y plane is aligned for the exposure apparatus 100.

In step S1052, the surface position of a predetermined region on the wafer 140 is measured by the focus control sensor 150. The predetermined region includes the region on the wafer 140, which is measured in the above-described focus calibration sequences. Therefore, the shape of the entire surface of the wafer 140 is measured by correcting the measurement value using the amount of offset Op(i) according to equation (2). Data on the surface shape of the wafer 140 corrected in this way is stored in the storage unit of the exposure apparatus 100.

In step S1053, the wafer stage 145 is driven to move the wafer 140 from the measurement position below the focus control sensor 150 so that the first exposure shot is positioned at the exposure position below the projection optical system 130. At this time, data on the surface shape of the first exposure shot is generated based on the data on the surface shape of the wafer 140, and the focus (Z direction) and tilt (tilt directions) are corrected so that the amount of shift of the surface of the wafer 140 relative to the exposure image plane becomes minimum. The surface of the wafer 140 is thus aligned with an optimal exposure image plane position for each exposure slit.

In step S1054, the pattern of the reticle 120 is transferred onto the wafer 140 by exposure. Since the exposure apparatus 100 is a scanner, the pattern of the reticle 120 is transferred onto the wafer 140 by scanning them in the Y direction (scanning direction).

In step S1055, it is determined whether all the exposure shots have been exposed already. If it is determined that all the exposure shot have not been exposed yet, the process returns to step S1052. Exposure is performed while matching the wafer 140 with an optimal exposure image plane for each exposure slit by generating data on the surface shape of the next exposure shot and correcting the focus and tilt. On the other hand, if it is determined that all the exposure shots have been exposed already, the wafer 140 is unloaded from the exposure apparatus 100 in step S1056.

In this embodiment, immediately before each exposure shot is exposed, data on the surface shape of each exposure shot is generated, and the amount of shift from the exposure image plane and the driving amount of the wafer stage 145 are calculated. However, before the first exposure shot is exposed, data on the surface shape of each exposure shot may be generated, and the amount of shift from the exposure image plane and the driving amount of the wafer stage 145 may be calculated for all the exposure shots.

The wafer stage 145 is not particularly limited to a single stage, and may have a so-called twin-stage arrangement having two stages, that is, an exposure stage for use in exposure and a measurement stage for use in the alignment and surface shape measurement of the wafer 140. In this case, the focus control sensor 150 and measuring apparatus 1 are arranged on the side of the measurement stage.

A wafer to be measured and processed by an exposure apparatus has a complicated circuit pattern and scribe line formed on it, so a certain reflectance distribution, local tilt, and the like are more likely to occur. Hence, the effect of reducing measurement errors due to a certain reflectance distribution or local tilt according to the present invention is great. As long as the wafer surface shape can be measured with high accuracy, the accuracy of focusing between the exposure image plane and the wafer surface can be improved. This leads to improvements in the performance of semiconductor devices and in fabrication yield. Semiconductor devices are fabricated by a step of exposing a substrate (e.g., a wafer or glass plate) coated with a resist (photosensitive agent) using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-260358 filed on Oct. 3, 2007, which is hereby incorporated by reference herein in its entirety.

What is claimed is:

1. A measuring apparatus which measures a shape of a surface of a measurement target object, comprising:
   a light projecting optical system configured to split light from a light source into measurement light and reference light so that the measurement light enters the surface of the measurement target object and the reference light enters a reference mirror;
   a light receiving optical system configured to guide the measurement light reflected by the surface of the measurement target object and the reference light reflected by the reference mirror to a photoelectric conversion device; and
   a processing unit configured to calculate the shape of the surface of the measurement target object based on an interference pattern which is detected by the photoelectric conversion device and formed by the measurement light and the reference light,
   wherein at least one of said light projecting optical system and said light receiving optical system includes an imaging optical system including a plurality of mirrors which include a concave surface mirror and a convex surface mirror,
   a magnification of said imaging optical system is determined by said plurality of mirrors,
   the convex surface mirror has a curvature twice a curvature of the concave surface mirror, and
   the concave surface mirror and the convex surface mirror are arranged such that the center of curvature of the concave surface mirror does not match the center of curvature of the convex surface mirror.

2. The apparatus according to claim 1, wherein each of said light projecting optical system and said light receiving optical system includes said imaging optical system.

3. The apparatus according to claim 1, wherein the magnification of said imaging optical system is variable.

4. The apparatus according to claim 3, wherein at least one of said concave surface mirror and said convex surface mirror includes not less than two portions having different curvatures.

5. The apparatus according to claim 1, wherein said light projecting optical system guides the measurement light to obliquely enter the surface of the measurement target object, and guides the reference light to obliquely enter the reference mirror.

6. The apparatus according to claim 1, further comprising a driving unit configured to drive the measurement target object,
   wherein the photoelectric conversion device detects the interference pattern while said driving unit drives the measurement target object.

7. An exposure apparatus comprising:
   an illumination optical system configured to illuminate a reticle;
   a projection optical system configured to project a pattern of the reticle onto a substrate;
   a measuring apparatus configured to measure a shape of a surface of one of the substrate and a resist applied on the substrate; and
   a stage configured to correct a position of the substrate based on the measurement result obtained by said measuring apparatus,
   wherein said measuring apparatus includes:
   a light projecting optical system configured to split light from a light source into measurement light and reference light so that the measurement light enters the surface of one of the substrate and the resist applied on the substrate and the reference light enters a reference mirror;
   a light receiving optical system configured to guide the measurement light reflected by the surface of one of the substrate and the resist applied on the substrate and the reference light reflected by the reference mirror to a photoelectric conversion device; and
   a processing unit configured to calculate the shape of the surface of one of the substrate and the resist applied on the substrate based on an interference pattern which is detected by the photoelectric conversion device and formed by the measurement light and the reference light,
   wherein at least one of said light projecting optical system and said light receiving optical system includes an imaging optical system including a plurality of mirrors which include a concave surface mirror and a convex surface mirror,
   a magnification of said imaging optical system is determined by said plurality of mirrors,
   the convex surface mirror has a curvature twice a curvature of the concave surface mirror, and
   the concave surface mirror and the convex surface mirror are arranged such that the center of curvature of the concave surface mirror does not match the center of curvature of the convex surface mirror.

8. The apparatus according to claim 7, further comprising a sensor configured to measure a position of the surface of one of the substrate and the resist applied on the substrate,
   wherein the measurement result obtained by said sensor is calibrated based on the measurement result obtained by said measuring apparatus.

9. A device fabrication method comprising steps of:
   exposing a substrate using an exposure apparatus; and
   performing a development process for the substrate exposed,
   wherein said exposure apparatus includes:
   an illumination optical system configured to illuminate a reticle;
   a projection optical system configured to project a pattern of the reticle onto the substrate;
   a measuring apparatus configured to measure a shape of a surface of one of the substrate and a resist applied on the substrate; and
   a stage configured to correct a position of the substrate based on the measurement result obtained by said measuring apparatus,
   wherein said measuring apparatus includes:
   a light projecting optical system configured to split light from a light source into measurement light and reference light so that the measurement light enters the surface of one of the substrate and the resist applied on the substrate and the reference light enters a reference mirror;
   a light receiving optical system configured to guide the measurement light reflected by the surface of one of the substrate and the resist applied on the substrate and the reference light reflected by the reference mirror to a photoelectric conversion device; and a processing unit configured to calculate the shape of the surface of one of the substrate and the resist applied on the substrate based on an interference pattern which is detected by the photoelectric conversion device and formed by the measurement light and the reference light, wherein at least one of said light projecting optical system and said light receiving optical system includes an imaging optical system including a plurality of mirrors which include a concave surface mirror and a convex surface mirror, a magnification of said imaging optical system is determined by said plurality of mirrors, the convex surface mirror has a curvature twice a curvature of the concave surface mirror, and the concave surface mirror and the convex surface mirror are arranged such that the center of curvature of the concave surface mirror does not match the center of curvature of the convex surface mirror.

* * * * *